United States Patent
Song et al.

(10) Patent No.: US 9,515,202 B2
(45) Date of Patent: Dec. 6, 2016

(54) COMPOSITION FOR FORMING SOLAR CELL ELECTRODE, AND ELECTRODE PRODUCED FROM COMPOSITION

(71) Applicant: CHEIL INDUSTRIES, INC., Gumi-si, Gyeongsangbuk-do (KR)

(72) Inventors: Dae Sub Song, Uiwang-si (KR); Jae Ho Kim, Uiwang-si (KR); Sang Hyun Yang, Uiwang-si (KR); Young Wook Choi, Uiwang-si (KR)

(73) Assignee: Cheil Industries, Inc., Gumi-Si, Gyeongsangbuk-do (KR)

( * ) Notice: Subject to any disclaimer, the term of this patent is extended or adjusted under 35 U.S.C. 154(b) by 0 days.

(21) Appl. No.: 14/739,875

(22) Filed: Jun. 15, 2015

(65) Prior Publication Data
US 2015/0280024 A1 Oct. 1, 2015

Related U.S. Application Data

(63) Continuation of application No. PCT/KR2014/001223, filed on Feb. 14, 2014.

(30) Foreign Application Priority Data

Sep. 13, 2013 (KR) .................. 10-2013-0110719
Feb. 13, 2014 (KR) .................. 10-2014-0016947

(51) Int. Cl.
*H01L 31/00* (2006.01)
*H01L 31/0224* (2006.01)
(Continued)

(52) U.S. Cl.
CPC ......... *H01L 31/022425* (2013.01); *H01B 1/22* (2013.01); *H01L 31/18* (2013.01); *Y02E 10/50* (2013.01)

(58) Field of Classification Search
CPC ............ H01B 1/02; H01B 1/16; H01B 1/22; H01L 31/022425; H01L 31/022441; H01L 31/022; H01L 31/425
USPC .................................. 252/513, 514; 136/256
See application file for complete search history.

(56) References Cited

U.S. PATENT DOCUMENTS

2011/0197961 A1* 8/2011 Wu et al. ................... 136/256
2012/0061624 A1* 3/2012 Jung et al. .................. 252/513
(Continued)

FOREIGN PATENT DOCUMENTS

| CN | 1985360 A | 6/2007 |
|---|---|---|
| CN | 102077301 A | 5/2011 |

(Continued)

OTHER PUBLICATIONS

Office Action mailed Sep. 17, 2015 in corresponding Taiwanese Patent Application No. 103127631.
(Continued)

*Primary Examiner* — Khanh Tuan Nguyen
(74) *Attorney, Agent, or Firm* — Lee & Morse, P.C.

(57) ABSTRACT

A composition for solar cell electrodes includes a conductive powder, a glass frit, an organic vehicle, and a thixotropic agent, the composition satisfying each of Formulae 1 to 7 described herein. A solar cell electrode is produced from the composition. A method of manufacturing a solar cell includes printing the composition in a predetermined pattern over a front surface of a wafer, and firing the printed composition pattern to form at least electrode.

14 Claims, 2 Drawing Sheets

(51) Int. Cl.
*H01L 31/18* (2006.01)
*H01B 1/22* (2006.01)

(56) References Cited

U.S. PATENT DOCUMENTS

2013/0255766 A1* 10/2013 Shin .................. H01B 1/22
 136/256
2014/0306166 A1* 10/2014 Jung .................. H01B 1/22
 252/514

FOREIGN PATENT DOCUMENTS

| | | | |
|---|---|---|---|
| CN | 102257629 | A | 11/2011 |
| CN | 101796650 | B | 11/2012 |
| CN | 103077764 | A | 5/2013 |
| CN | 103077764 | A * | 5/2013 ............... H01B 1/16 |
| JP | 2012-023088 | A | 2/2012 |
| KR | 10-2007-0055489 | A | 5/2007 |
| KR | 10-2009-0110739 | A | 10/2009 |
| KR | 10-2010-0000685 | A | 1/2010 |
| KR | 2010-0000685 | A | 1/2010 |
| KR | 10-2010-0069950 | A | 6/2010 |
| KR | 10-2011-0040713 | A | 4/2011 |

OTHER PUBLICATIONS

Korean Office Action mailed Dec. 4, 2015.
Chinese Office Action dated Apr. 15, 2016 in Corresponding Chinese Patent Application No. 201480003843.5

* cited by examiner

COMPOSITION FOR FORMING SOLAR CELL ELECTRODE, AND ELECTRODE PRODUCED FROM COMPOSITION

CROSS-REFERENCE TO RELATED APPLICATIONS

This application is a continuation of International Appl. No. PCT/KR2014/001223, filed on Feb. 14, 2014, in the World Intellectual Property Office, and entitled: "COMPOSITION FOR FORMING SOLAR CELL ELECTRODE, AND ELECTRODE PRODUCED FROM COMPOSITION," the entire content of which is incorporated herein by reference.

This application claims priority to and the benefit of Korean Patent Application Nos. 10-2013-0110719, filed on Sep. 13, 2013, and 10-2014-0016947, filed on Feb. 13, 2014, in the Korean Intellectual Property Office, and entitled: "COMPOSITION FOR FORMING SOLAR CELL ELECTRODE, AND ELECTRODE PRODUCED FROM COMPOSITION," the entire contents of each of which are incorporated herein by reference.

BACKGROUND

1. Field

Embodiments relate to a composition for solar cell electrodes and electrodes produced using the same.

2. Description of the Related Art

Solar cells generate electricity using the photovoltaic effect of a p-n junction that converts photons of sunlight into electricity. In the solar cell, front and rear electrodes are formed on upper and lower surfaces of a semiconductor wafer or substrate with the p-n junctions, respectively. Then, the photovoltaic effect at the p-n junction is induced by sunlight entering the semiconductor wafer. Electrons generated by the photovoltaic effect at the p-n junction provide electric current to the outside through the electrodes.

SUMMARY

Embodiments are directed to a composition for solar cell electrodes, the composition including a conductive powder, a glass fit, an organic vehicle, and a thixotropic agent, the composition satisfying each of the following Formulae 1 to 7:

$$3 < TI\ 10(\text{viscosity at 1 rpm/viscosity at 10 rpm}) < 5.5; \quad \text{[Formula 1]}$$

$$4 < TI\ 20(\text{viscosity at 2 rpm/viscosity at 20 rpm}) < 7; \quad \text{[Formula 2]}$$

$$6 < TI\ 50(\text{viscosity at 5 rpm/viscosity at 50 rpm}) < 7.5; \quad \text{[Formula 3]}$$

$$6 < TI\ 100(\text{viscosity at 10 rpm/viscosity at 100 rpm}) < 7.5; \quad \text{[Formula 4]}$$

$$1 < |TI\ 10 - TI\ 20| < 2; \quad \text{[Formula 5]}$$

$$0.5 < |TI\ 20 - TI\ 50| < 1.5;\ \text{and} \quad \text{[Formula 6]}$$

$$0 \le |TI\ 50 - TI\ 100| < 0.8, \quad \text{[Formula 7]}$$

In Formulae 1 to 7, each thixotropic index (TI) is calculated by substituting the respective viscosities measured by a rotary viscometer at the stated revolutions per minute (rpm) using a No. 14 spindle at 23° C.

The composition may include about 50 wt % to about 90 wt % of the conductive powder, about 1 wt % to about 15 wt % of the glass fit, about 3 wt % to about 40 wt % of the organic vehicle, and about 0.01 wt % to about 2 wt % of the thixotropic agent.

The conductive powder may include one or more of silver, gold, palladium, platinum, copper, chromium, cobalt, aluminum, tin, lead, zinc, iron, iridium, osmium, rhodium, tungsten, molybdenum, nickel, or indium tin oxide.

The glass frit may include a leaded glass frit, a lead-free glass frit, or a mixture thereof.

The thixotropic agent may include one or more of an amine compound, a castor oil compound, a carbon black compound, a fatty acid amide compound, a fumed silica compound, an organo clay compound, or nano-scale organic-inorganic hybrid particles.

The glass frit may have an average particle diameter (D50) of about 0.1 μm to about 5 μm.

The composition may further include one or more of a dispersant, a plasticizer, a viscosity stabilizer, an anti-foaming agent, a pigment, a UV stabilizer, an antioxidant, and a coupling agent.

A pattern printed with the composition may have a linewidth of about 75 μm to about 90 μm, line thickness of about 15 μm to about 20 μm, and an aspect ratio (line thickness/linewidth) of about 0.15 or more.

Embodiments are also directed to a solar cell electrode produced from the composition for solar cell electrodes according to an embodiment.

Embodiments are also directed to a method of manufacturing a solar cell and a solar cell manufactured thereby, the method including printing the composition according to an embodiment in a predetermined pattern over a front surface of a wafer, and firing the printed composition pattern to form at least electrode.

BRIEF DESCRIPTION OF THE DRAWINGS

Features will become apparent to those of skill in the art by describing in detail example embodiments with reference to the attached drawings in which.

DETAILED DESCRIPTION

Figure 1:
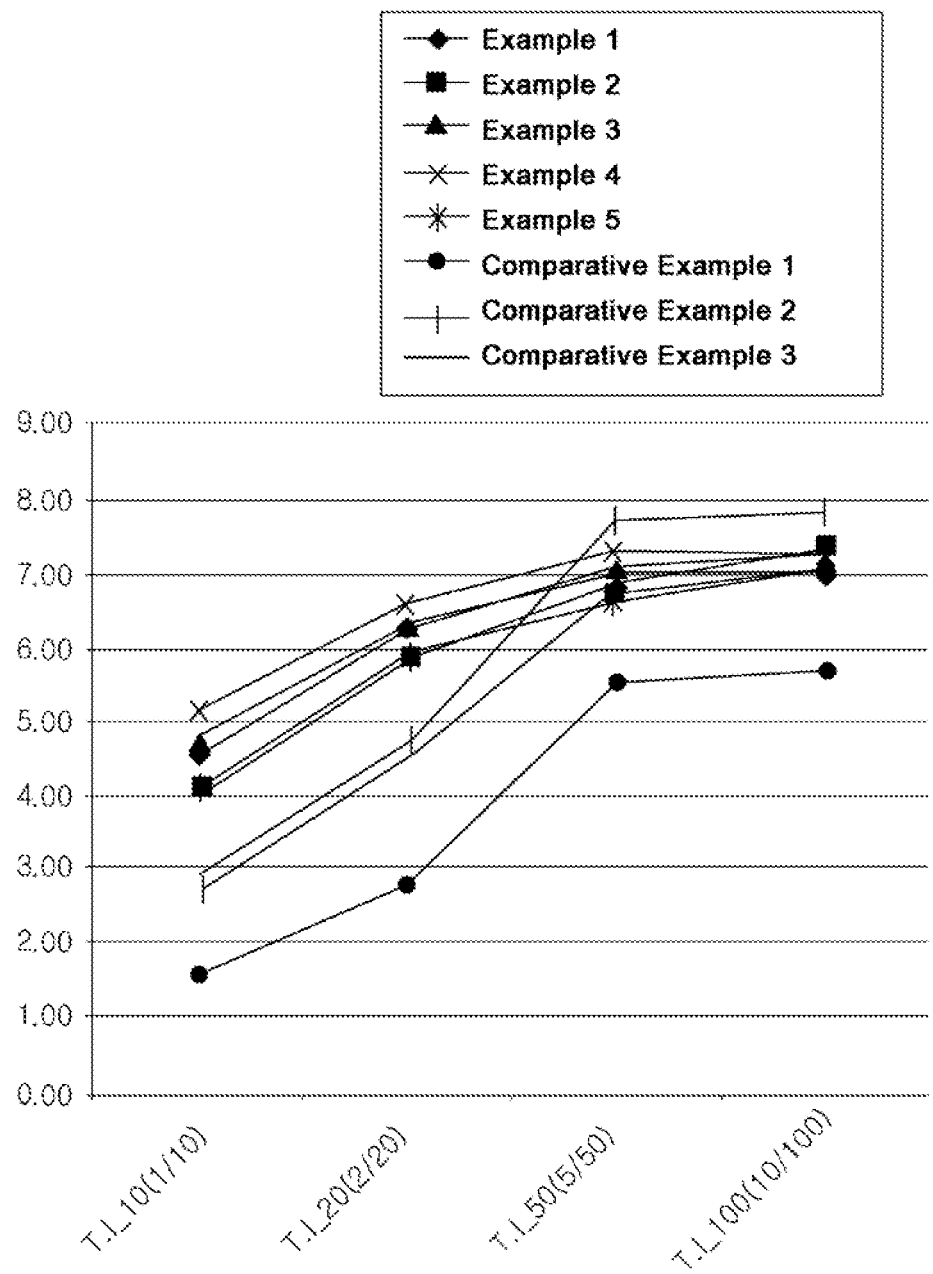
FIG. 1 illustrates a graph representing TI values measured in Examples 1 to 5 and Comparative Examples 1 to 3.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

According to an example embodiment, a composition for solar cell electrodes includes a conductive powder, a glass frit, an organic vehicle, and a thixotropic agent, and satisfies the following Formulae 1 to 7.

$$3 < TI\ 10(\text{viscosity at 1 rpm/viscosity at 10 rpm}) < 5.5; \quad \text{[Formula 1]}$$

$$4 < TI\ 20(\text{viscosity at 2 rpm/viscosity at 20 rpm}) < 7; \quad \text{[Formula 2]}$$

$$6 < TI\ 50(\text{viscosity at 5 rpm/viscosity at 50 rpm}) < 7.5; \quad \text{[Formula 3]}$$

$$6 < TI\ 100(\text{viscosity at 10 rpm/viscosity at 100 rpm}) < 7.5; \quad \text{[Formula 4]}$$

$$1 < |TI\ 10 - TI\ 20| < 2; \quad \text{[Formula 5]}$$

$$0.5 < |TI\ 20 - TI\ 50| < 1.5; \quad \text{[Formula 6]}$$

$$0 \leq |TI\ 50 - TI\ 100| < 0.8, \quad \text{[Formula 7]}$$

In Formulae 1 to 7, thixotropic index (TI) is calculated by substituting viscosity values measured at each revolutions per minute (rpm) using a No. 14 spindle by a rotary viscometer at 23° C.

The composition may include about 50 wt % to about 90 wt % of the conductive powder; about 1 wt % to about 15 wt % of the glass fit; about 3 wt % to about 40 wt % of the organic vehicle; and about 0.01 wt % to about 2 wt % of the thixotropic agent.

The conductive powder may include at least one selected from the group of silver (Ag), gold (Au), palladium (Pd), platinum (Pt), copper (Cu), chromium (Cr), cobalt (Co), aluminum (Al), tin (Sn), lead (Pb), zinc (Zn), iron (Fe), iridium (Ir), osmium (Os), rhodium (Rh), tungsten (W), molybdenum (Mo), nickel (Ni), and indium tin oxide (ITO).

The glass frit may include leaded glass frits, lead-free glass frits, or mixtures thereof.

The thixotropic agent may include at least one compound selected from the group of amine compounds, castor oil compounds, carbon black compounds, fatty acid amide compounds, fumed silica compounds, organo clay compounds, and nano-scale organic-inorganic hybrid particles.

The glass fit may have an average particle diameter (D50) of about 0.1 μm to about 5 μm.

The composition may further include at least one additive selected from the group of dispersants, plasticizers, viscosity stabilizers, anti-foaming agents, pigments, UV stabilizers, antioxidants, and coupling agents.

A pattern printed with the composition has a linewidth of about 75 μm to about 90 μm, a line thickness of about 15 μm to about 20 μm, and an aspect ratio (line thickness/linewidth) of 0.15 or more.

According to an embodiment, solar cell electrodes may be fabricated using the composition according to an embodiment.

Composition for Solar Cell Electrodes

A composition for solar cell electrodes according to the present example embodiment includes a conductive powder (A), a glass frit (B), an organic vehicle (C), and a thixotropic agent (D), and may be printed in fine linewidth on a substrate by screen-printing, and may provide high conversion efficiency.

(A) Conductive Powder

As the conductive powder, a suitable organic or inorganic powder having conductivity may be used. In an example embodiment, the conductive powder includes one or more of silver (Ag), gold (Au), palladium (Pd), platinum (Pt), copper (Cu), chromium (Cr), cobalt (Co), aluminum (Al), tin (Sn), lead (Pb), zinc (Zn), iron (Fe), iridium (Ir), osmium (Os), rhodium (Rh), tungsten (W), molybdenum (Mo), nickel (Ni), or indium tin oxide (ITO) powder. These conductive powders may be used alone or in combination of two or more thereof. For example, the conductive powder may include silver (Ag) particle, and may further include nickel (Ni), cobalt (Co), iron (Fe), zinc (Zn), or copper (Cu) particles.

The conductive powder may have an average particle diameter (D50) of about 0.1 μm to about 10 μm. For example, the conductive powder may have an average particle diameter of about 0.2 μm to about 7 μm, or about 0.5 μm to about 5 μm.

The conductive powder may be present in an amount of about 50 wt % to about 90 wt % based on the total weight of the composition. For example, the conductive powder may be present in an amount of about 70 wt % to about 90 wt %. Within this range, the conductive powder may help prevent deterioration in conversion efficiency due to resistance increase, and help prevent difficulties in forming the paste due to relative reduction in amount of the organic vehicle, while providing suitable dispersion, fluidity and printability to the composition.

(B) Glass Frit

The glass frits may generate silver crystal grains in an emitter region by etching an anti-reflection layer and melting the silver powder so as to reduce contact resistance during the baking process of the paste for electrodes. Further, the glass frits serve to enhance adhesion between the conductive powder and the wafer, and are softened to decrease the baking temperature during the baking process.

When the area of the solar cell is increased in order to improve efficiency or fill factor of the solar cell, a contact resistance of the solar cell may increase. Thus, both serial resistance and damage on the p-n junction should be minimized. In addition, as the baking temperatures varies within a broad range with increasing use of various wafers having different sheet resistances, it is desirable that the glass frits secure sufficient thermal stability to withstand a wide range of baking temperatures.

The glass frit may be at least one of leaded glass frits and lead-free glass frits, such as those generally used in compositions for solar cell electrodes.

The glass frit may include one or mixture of two or more metal oxide such as lead oxide, silicon oxide, tellurium oxide, bismuth oxide, zinc oxide, boron oxide, aluminum oxide, tungsten oxide, etc. For example, the glass frit may include zinc oxide-silicon oxide (ZnO—SiO$_2$), zinc oxide-boron oxide-silicon oxide (ZnO—B$_2$O$_3$—SiO$_2$), zinc oxide-boron oxide-silicon oxide-aluminum oxide (ZnO—B$_2$O$_3$—SiO$_2$—Al$_2$O$_3$), bismuth oxide-silicon oxide (Bi$_2$O$_3$—SiO$_2$), bismuth oxide-boron oxide-silicon oxide (Bi$_2$O$_3$—B$_2$O$_3$—SiO$_2$), bismuth oxide-boron oxide-silicon oxide-aluminum oxide (Bi$_2$O$_3$—B$_2$O$_3$—SiO$_2$—Al$_2$O$_3$), bismuth oxide-zinc oxide-boron oxide-silicon oxide (Bi$_2$O$_3$—ZnO—B$_2$O$_3$—SiO$_2$), bismuth oxide-zinc oxide-boron oxide-silicon oxide-aluminum oxide (Bi$_2$O$_3$—ZnO—B$_2$O$_3$—SiO$_2$—Al$_2$O$_3$) glass frits, and the like.

The glass frit may be prepared from such metal oxides by a suitable method. For example, the metal oxides may be mixed in a predetermined ratio. Mixing may be carried out using a ball mill or a planetary mill. The mixture may be melted at about 900° C. to about 1300° C., followed by quenching to about 25° C. The obtained resultant may be subjected to pulverization using a disc mill, a planetary mill, or the like, thereby preparing a glass frit.

The glass frit may have a spherical or amorphous shape.

The glass frit may be purchased or may be prepared by selectively melting, for example, silicon dioxide (SiO$_2$), aluminum oxide (Al$_2$O$_3$), boron oxide (B$_2$O$_3$), bismuth oxide (Bi$_2$O$_3$), sodium oxide (Na$_2$O), zinc oxide (ZnO), and the like, so as to have a desired composition.

The glass fit may be present in an amount of about 1 wt % to about 15 wt %, for example about 2 wt % to about 10 wt %, based on the total weight of the composition. Within this content range, the glass frit may provide suitable dispersibility, fluidity, and printability to the composition.

(C) Organic Vehicle

The organic vehicle imparts suitable viscosity and rheological characteristics for printing to the composition for solar cell electrodes through mechanical mixing with the inorganic component of the composition.

The organic vehicle may be a suitable organic vehicle used in solar cell electrode compositions, and may include a binder resin, a solvent, and the like.

As the binder resin, acrylate resins or cellulose resins may be used. Ethyl cellulose may be used as the binder resin. In addition, ethyl hydroxyethyl cellulose, nitro cellulose, blends of ethyl cellulose and phenol resins, alkyd resins, phenolic resins, acrylate ester resins, xylene resins, polybutene resins, polyester resins, urea resins, melamine resins, vinyl acetate resins, wood rosins, polymethacrylates of alcohols, and the like may be used.

The solvent may be include one or more of, for example, hexane, toluene, ethyl cellosolve, cyclohexanone, butyl cellosolve, butyl carbitol (diethylene glycol monobutyl ether), dibutyl carbitol (diethylene glycol dibutyl ether), butyl carbitol acetate (diethylene glycol monobutyl ether acetate), propylene glycol monomethyl ether, hexylene glycol, terpineol, methylethylketone, benzylalcohol, γ-butyrolactone, ethyl lactate, etc.

The organic vehicle may be present in an amount of about 3 wt % to about 40 wt % based on the total weight of the composition. Within this range, the organic vehicle may provide sufficient adhesive strength and excellent printability to the composition.

(D) Thixotropic Agent

According to the present example embodiment, the composition includes a thixotropic agent. The thixotropic agent may include at least one compound selected from the group of amine compounds, castor oil compounds, carbon black compounds, fatty acid amide compounds, fumed silica compounds, organo clay compounds, and nano-scale organic-inorganic hybrid particles.

In an example embodiment, examples of thixotropic agent may include THIXATROL P600 (Elementis Co.) as the amine compounds, THIXATROL ST (Elementis Co.) as the castor oil compounds, VULCAN XC72 (Cabot Co.) as the carbon black compounds, Flownon (Kyoeisha Co.) as the fatty acid amide compounds, A200 (Evonik Co.) as the fumed silica compounds, BENTONE SD-3 (Elementis Co.) as the organo clay compounds, etc.

The thixotropic agent may be present in an amount of about 0.01 wt % to about 2 wt %, for example about 0.05 wt % to about 1 wt %, based on the total weight of the composition. Within this range, the thixotropic agent may provide sufficient adhesive strength and excellent printability to the composition.

(E) Other Additives

The composition may further include general additives to enhance flow and process properties and stability. The additives may include dispersants, plasticizers, viscosity stabilizers, anti-foaming agents, pigments, UV stabilizers, antioxidants, coupling agents, and the like. These additives may be used alone or as mixtures thereof. These additives may be present in an amount of, for example, 0.1 wt % to 5 wt % based on the total weight of the composition.

The composition for solar cell electrodes according to the present example embodiment may be applied using screen-printing. According to an example embodiment, the composition satisfies the following Formulae 1 to 7. The composition may exhibit fine pattern printability and high conversion efficiency.

$$3 < TI\ 10 (\text{viscosity at 1 rpm/viscosity at 10 rpm}) < 5.5; \quad [\text{Formula 1}]$$

$$4 < TI\ 20 (\text{viscosity at 2 rpm/viscosity at 20 rpm}) < 7; \quad [\text{Formula 2}]$$

$$6 < TI\ 50 (\text{viscosity at 5 rpm/viscosity at 50 rpm}) < 7.5; \quad [\text{Formula 3}]$$

$$6 < TI\ 100 (\text{viscosity at 10 rpm/viscosity at 100 rpm}) < 7.5; \quad [\text{Formula 4}]$$

$$1 < |TI\ 10 - TI\ 20| < 2; \quad [\text{Formula 5}]$$

$$0.5 < |TI\ 20 - TI\ 50| < 1.5; \quad [\text{Formula 6}]$$

$$0 \leq |TI\ 50 - TI\ 100| < 0.8, \quad [\text{Formula 7}]$$

In Formulae 1 to 7, a thixotropic index (TI) is calculated by substituting the viscosity values measured at each different revolutions per minute (rpm) and at 23° C. with a No. 14 Spindle using a rotary viscometer.

Specifically, in Formulae 1 to 4, the thixotropic index (TI) may be defined as a ratio of viscosity values measured at different revolutions per minute (rpm) of a rotary viscometer. By way of example, the thixotropic index TI 10 means a ratio of viscosity at 1 rpm to viscosity at 10 rpm as measured using a No. 14 spindle by the rotary viscometer at 23° C., and the thixotropic index TI 20 means a ratio of viscosity at 2 rpm to viscosity at 20 rpm as measured using a No. 14 spindle by the rotary viscometer at 23° C. One example of the rotary viscometer may include HBDV-II+Pro (Brookfield Co., Ltd.).

The composition for solar cell electrodes may have a viscosity of about 200 Pa·s to about 600 Pa·s in terms of printability. Here, the viscosity is measured by the rotary viscometer at 23° C. and 10 rpm.

When the composition for solar cell electrodes according to the present example embodiment is printed on a substrate, for example, by screen-printing, a printed pattern may have a linewidth of about 75 μm to about 90 μm and a line thickness of about 15 μm to about 20 μm. Further, the composition may provide an aspect ratio (line thickness/linewidth) of about 0.15 or more, for example about 0.15 to about 0.20, or about 0.16 to about 0.18. Within this range of aspect ratio, the composition may exhibit excellent printability.

Solar Cell Electrode and Solar Cell Including the Same

Figure 2:
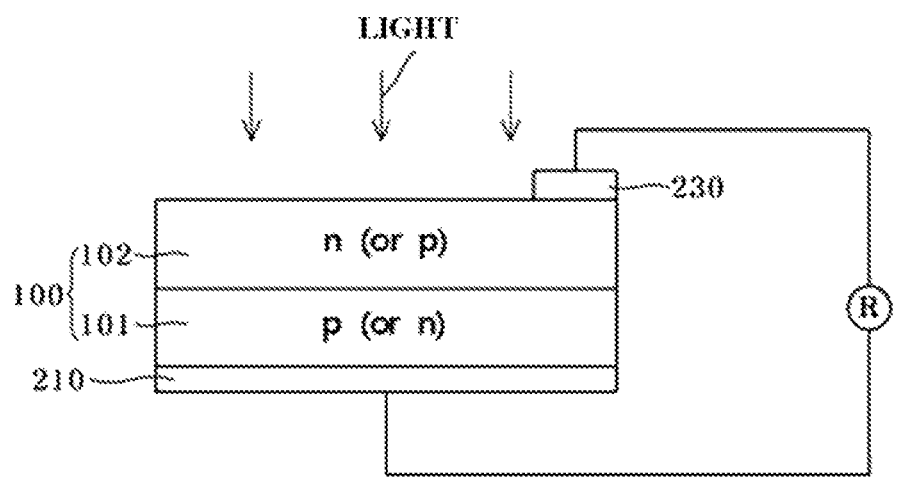
FIG. 2 illustrates a schematic view of a solar cell structure in accordance with an example embodiment.

Other example embodiments relate to an electrode formed of the composition for solar cell electrodes and a solar cell including the same. FIG. 2 shows a solar cell in accordance with an example embodiment.

Referring to FIG. 2, a rear electrode 210 and a front electrode 230 may be formed by printing and baking the composition on a wafer or substrate 100 that includes a p-layer (or n-layer) 101 and an n-layer (or p-layer) 102, which will serve as an emitter. For example, a preliminary process of preparing the rear electrode may be performed by printing the composition on the rear surface of the wafer and drying the printed composition at about 200° C. to about 400° C. for about 10 seconds to about 60 seconds. Further, a preliminary process for preparing the front electrode may be performed by printing the paste on the front surface of the wafer and drying the printed composition. Then, the front electrode and the rear electrode may be formed by baking or firing the wafer at about 400° C. to about 950° C., for example, at about 750° C. to about 950° C., for about 30 seconds to about 50 seconds.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLES

Examples 1 to 5 and Comparative Examples 1 to 3

Example 1

As an organic binder, 0.7 wt % of ethyl cellulose (STD4, SDT200, Dow Chemical Company) was sufficiently dissolved in 3.3 wt % of Texanol (3-hydroxy-2,2,4,4-tetramethyl pentyl isobutyrate) at 60° C. to prepare an organic vehicle, and 88 wt % of spherical silver powder (AG-4-8, Dowa Hightech Co., Ltd.) having an average particle diameter of 2.0 μm, 2.7 wt % of a low melting point crystalline glass powder (Pb—Bi—Te—O) having an average particle diameter of 1.0 μm and a transition point of 280° C., 0.6 wt % of a dispersant (BYK145, BYK-Chemie, (E-1)), and 4.3 wt % of a plasticizer (dimethylene glycol, (E-2)) and 0.4 wt % of a thixotropic agent Thixatrol ST (Elementis Co.) were added to the organic vehicle, followed by mixing and kneading in a 3-roll kneader, thereby preparing a composition for solar cell electrodes.

The composition was printed in a predetermined pattern over a front surface of a wafer by screen-printing. Properties of the composition were measured by the following method and results are shown in the following Table 2.

Examples 2 to 5 and Comparative Examples 1 to 3

Compositions for solar cell electrodes were prepared in the same manner as in Example 1 except that the components of the compositions were used in amounts as listed in Table 1. Thereafter, the compositions were printed by screen-printing Property Measurement Measurement of thixotropic index (TI): Thixotropic index was calculated using the ratio of viscosity values measured at 23° C. using a No. 14 spindle by a rotary viscometer HBDV-II+Pro (Brookfield Co., Ltd.). For measurement of viscosity, a sample cup was completely filled with a specimen and equipped with the spindle. After temperature stabilization for 5 minutes, viscosity was measured at the following maintenance time.

TABLE 1

| | 1 rpm | 2 rpm | 5 rpm | 10 rpm | 20 rpm | 50 rpm | 100 rpm |
|---|---|---|---|---|---|---|---|
| Maintenance time | 60 sec | 30 sec | 15 sec | 15 sec | 15 sec | 15 sec | 15 sec |

Based on the measured viscosity values, thixotropic indices in Formulae 1 to 4 and change rates of thixotropic index in Formulae 5 to 7 were calculated. Results are shown in Table 1 and FIG. 1.

Methods of Property Evaluation

Measurement of serial resistance, short circuit current, and conversion efficiency: The compositions prepared in Examples and Comparative Examples were deposited over a front surface of a mono crystalline wafer by screen printing in a predetermined pattern, followed by drying in an IR drying furnace. Cells formed according to this procedure were subjected to baking at 600° C. to 900° C. for 60 seconds to 210 seconds in a belt-type baking furnace, and evaluated as to conversion efficiency (%), short circuit current (Isc), and serial resistance (Rs) using a solar cell efficiency tester CT-801 (Pasan Co., Ltd).

Measurement of printability: Each of the compositions for solar cell electrodes prepared as above was printed in a predetermined pattern over a surface of a wafer using a screen mask designed to have a linewidth of 30 μm by screen-printing. The printed wafer was dried, baked, and observed at 9 portions of the pattern through a three-dimensional microscope, followed by confirmation of disconnection of the pattern through an EL analyzer.

Measurement of aspect ratio: Each of the compositions for solar cell electrodes prepared as above was printed in a predetermined pattern over a surface of a wafer using a screen mask designed to have a linewidth of 30 μm by screen-printing. The printed wafer was dried, baked, and observed at 9 portions of the pattern through a three-dimensional microscope. The aspect ratio was obtained as an average value.

TABLE 2

| | | Ex. 1 | Ex. 2 | Ex. 3 | Ex. 4 | Ex. 5 | Comp. Ex. 1 | Comp. Ex. 2 | Comp. Ex. 3 |
|---|---|---|---|---|---|---|---|---|---|
| (A) Conductive powder | | 88 | 88 | 88 | 88 | 88 | 89 | 88 | 88 |
| (B) Glass frit | | 2.7 | 2.7 | 2.5 | 2.7 | 3.5 | 2.1 | 3 | 2.7 |
| (C) Organic vehicle | Organic binder | 0.7 | 1.2 | 0.8 | 0.6 | 0.7 | 0.5 | 0.8 | 0.6 |
| | Solvent | 3.3 | 3.1 | 3.4 | 2.9 | 3.3 | 2.6 | 3.7 | 3.4 |
| (D) Thixotropic agent | | 0.4 | 0.4 | 0.4 | 0.4 | 0.5 | 0.5 | 0.3 | 0.4 |
| (E) total Additive | | 4.9 | 4.6 | 4.9 | 5.4 | 4 | 5.3 | 4.2 | 4.9 |
| (E-1) Dispersant | | 0.6 | 0.6 | 0.6 | 0.6 | 0.6 | 0.6 | 0.6 | 0.6 |
| (E-2) Plasticizer | | 4.3 | 4.0 | 4.3 | 4.8 | 3.4 | 4.7 | 3.6 | 4.3 |
| TI | TI 10 | 4.12 | 4.61 | 4.76 | 5.21 | 4.02 | 1.63 | 2.93 | 2.73 |
| | TI 20 | 5.91 | 6.34 | 6.33 | 6.60 | 5.86 | 2.79 | 4.71 | 4.52 |
| | TI 50 | 6.86 | 7.02 | 7.28 | 7.32 | 6.63 | 5.53 | 7.70 | 6.71 |
| | TI 100 | 7.40 | 7.01 | 7.21 | 7.28 | 7.30 | 5.74 | 7.82 | 7.04 |
| | |TI 10 − TI 20| | 1.79 | 1.73 | 1.57 | 1.39 | 1.84 | 1.16 | 1.79 | 1.79 |
| | |TI 20 − TI 50| | 0.95 | 0.68 | 0.95 | 0.72 | 0.77 | 2.75 | 2.99 | 2.19 |

TABLE 2-continued

|  | Ex. 1 | Ex. 2 | Ex. 3 | Ex. 4 | Ex. 5 | Comp. Ex. 1 | Comp. Ex. 2 | Comp. Ex. 3 |
|---|---|---|---|---|---|---|---|---|
| \|TI 50 − TI 100\| | 0.54 | 0.00 | 0.00 | 0.00 | 0.67 | 0.20 | 0.11 | 0.33 |
| Short circuit current [A] | 8.739 | 8.745 | 8.732 | 8.754 | 8.756 | 8.723 | 8.692 | 8.809 |
| Serial resistance [m ohm] | 4.93 | 4.95 | 4.94 | 4.98 | 5.04 | 5.23 | 5.03 | 7.22 |
| Conversion efficiency (%) | 17.35 | 17.45 | 17.30 | 17.40 | 17.32 | 17.1 | 16.9 | 16.42 |
| 30 μm printability (number of disconnected lines) | <10 | <10 | <10 | <10 | <10 | <20 | <20 | >40 |
| Aspect ratio (higher values are better) | 0.17 | 0.16 | 0.17 | 0.16 | 0.18 | 0.15 | 0.14 | 0.18 |

As shown in result of Table 2 and the graph in FIG. 1, it was ascertained that the compositions prepared in Examples 1 to 5, which satisfy Formulae 1 to 7, had excellent fine pattern printability, and the solar cell electrodes prepared using the compositions had low serial resistance and high conversion efficiency.

By way of summation and review, the electrodes of a solar cell may be formed on the wafer by applying, patterning, and baking an electrode composition. Generally, a method of printing a composition for solar cell electrodes on a substrate may include gravure offset printing or screen-printing. It is important to use a composition for solar cell electrode that can be printed in fine linewidth and high aspect ratio on a substrate. Gravure offset printing is significantly influenced by viscosity, dryness, and adhesion of the composition. And screen-printing is significantly influenced by rheology or thixotropy.

As described above, embodiments relate to a composition for solar cell electrodes, which may be printed in fine linewidth and high aspect ratio on a substrate by screen-printing and may provide high conversion efficiency, and electrodes produced using the same.

A composition for solar cell electrodes according to embodiments may provide a printed pattern in fine linewidth and high aspect ratio.

A composition for solar cell electrodes according to embodiments may provide high conversion efficiency.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A composition for solar cell electrodes, the composition comprising:
   a conductive powder, a glass frit, an organic vehicle, and a thixotropic agent, the composition satisfying each of the following Formulae 1 to 7:

$3 < TI\ 10(\text{viscosity at 1 rpm/viscosity at 10 rpm}) < 5.5;$ [Formula 1]

$4 < TI\ 20(\text{viscosity at 2 rpm/viscosity at 20 rpm}) < 7;$ [Formula 2]

$6 < TI\ 50(\text{viscosity at 5 rpm/viscosity at 50 rpm}) < 7.5;$ [Formula 3]

$6 < TI\ 100(\text{viscosity at 10 rpm/viscosity at 100 rpm}) < 7.5;$ [Formula 4]

$1 < |TI\ 10 - TI\ 20| < 2;$ [Formula 5]

$0.5 < |TI\ 20 - TI\ 50| < 1.5;$ and [Formula 6]

$0 \leq |TI\ 50 - TI\ 100| < 0.8,$ [Formula 7]

wherein, in Formulae 1 to 7, TI is thixotropic index, rpm is revolutions per minute, and each thixtropic incex is calculated by substituting the respective viscosities measured by a rotary viscometer at the stated revolutions per minute using a No. 14 spindle at 23° C.

2. The composition according to claim 1, comprising:
   about 50 wt % to about 90 wt % of the conductive powder;
   about 1 wt % to about 15 wt % of the glass fit;
   about 3 wt % to about 40 wt % of the organic vehicle; and
   about 0.01 wt % to about 2 wt % of the thixotropic agent.

3. The composition according to claim 1, wherein the conductive powder includes one or more of silver, gold, palladium, platinum, copper, chromium, cobalt, aluminum, tin, lead, zinc, iron, iridium, osmium, rhodium, tungsten, molybdenum, nickel, or indium tin oxide.

4. The composition according to claim 1, wherein the glass frit includes a leaded glass frit, a lead-free glass frit, or a mixture thereof.

5. The composition according to claim 1, wherein the thixotropic agent includes one or more of an amine compound, a castor oil compound, a carbon black compound, a fatty acid amide compound, a fumed silica compound, an organo clay compound, or nano-scale organic-inorganic hybrid particles.

6. The composition according to claim 1, wherein the glass frit has a D50 average particle diameter of about 0.1 μm to about 5 μm.

7. The composition according to claim 1, wherein the composition further comprises one or more of a dispersant, a plasticizer, a viscosity stabilizer, an anti-foaming agent, a pigment, a UV stabilizer, an antioxidant, and a coupling agent.

8. The composition according to claim 1, wherein a pattern printed with the composition has a linewidth of about 75 μm to about 90 μm, a line thickness of about 15 μm to about 20 μm, and an aspect ratio (line thickness/linewidth) of about 0.15 or more.

9. A solar cell electrode produced from the composition for solar cell electrodes according to claim 1.

10. A method of manufacturing a solar cell, the method comprising:
printing the composition according to claim 1 in a predetermined pattern over a front surface of a wafer; and
firing the printed composition pattern to form at least electrode.

11. A solar cell manufactured according to the method of claim 10.

12. The composition according to claim 1, comprising about 3 wt % to 7 wt % of the organic vehicle.

13. The composition according to claim 1, comprising about 3 wt % to 4.3 wt % of the organic vehicle.

14. A composition for solar cell electrodes, the composition comprising:
a conductive powder, a glass frit, an organic vehicle, and a thixotropic agent, the composition including:
about 50 wt % to about 90 wt % of the conductive powder;
about 1 wt % to about 15 wt % of the glass fit;
about 3 wt % to 7 wt % of the organic vehicle; and
about 0.01 wt % to about 2 wt % of the thixotropic agent,
the conductive powder including one or more of silver, gold, palladium, platinum, copper, chromium, cobalt, aluminum, tin, lead, zinc, iron, iridium, osmium, rhodium, tungsten, molybdenum, nickel, or indium tin oxide,
the glass frit including a leaded glass frit, a lead-free glass frit, or a mixture thereof, and having a D50 average particle diameter of about 0.1 μm to about 5 μm, and
the thixotropic agent including one or more of an amine compound, a castor oil compound, a carbon black compound, a fatty acid amide compound, a fumed silica compound, an organo clay compound, or nanoscale organic-inorganic hybrid particles,
the composition satisfying each of the following Formulae 1 to 7:

$3 < TI\ 10(\text{viscosity at 1 rpm/viscosity at 10 rpm}) < 5.5;$  [Formula 1]

$4 < TI\ 20(\text{viscosity at 2 rpm/viscosity at 20 rpm}) < 7;$  [Formula 2]

$6 < TI\ 50(\text{viscosity at 5 rpm/viscosity at 50 rpm}) < 7.5;$  [Formula 3]

$6 < TI\ 100(\text{viscosity at 10 rpm/viscosity at 100 rpm}) < 7.5;$  [Formula 4]

$1 < |TI\ 10 - TI\ 20| < 2;$  [Formula 5]

$0.5 < |TI\ 20 - TI\ 50| < 1.5;$ and  [Formula 6]

$0 \leq |TI\ 50 - TI\ 100| < 0.8,$  [Formula 7]

wherein, in Formulae 1 to 7, TI is thixotropic index, rpm is revolutions per minute, and each thixotropic index is calculated by substituting the respective viscosities measured by a rotary viscometer at the stated revolutions per minute using a No. 14 spindle at 23° C.

* * * * *